US010964405B2

(12) United States Patent
Ng

(10) Patent No.: US 10,964,405 B2
(45) Date of Patent: Mar. 30, 2021

(54) MEMORY INITIALIZATION REPORTING AND CONTROL

(71) Applicant: ATI Technologies ULC, Markham (CA)

(72) Inventor: Philip Ng, Toronto (CA)

(73) Assignee: ATI Technologies ULC, Markham (CA)

(*) Notice: Subject to any disclaimer, the term of this patent is extended or adjusted under 35 U.S.C. 154(b) by 92 days.

(21) Appl. No.: 16/205,785

(22) Filed: Nov. 30, 2018

(65) Prior Publication Data

US 2020/0176071 A1    Jun. 4, 2020

(51) Int. Cl.
| | | |
|---|---|---|
| G11C 29/00 | (2006.01) | |
| G11C 29/38 | (2006.01) | |
| G06F 3/06 | (2006.01) | |
| G06F 11/22 | (2006.01) | |
| G06F 13/16 | (2006.01) | |

(52) U.S. Cl.
CPC .......... G11C 29/38 (2013.01); G06F 3/0604 (2013.01); G06F 3/0632 (2013.01); G06F 3/0673 (2013.01); G06F 11/2284 (2013.01); G06F 13/1668 (2013.01)

(58) Field of Classification Search
CPC ..... G11C 29/38; G06F 3/0604; G06F 3/0632; G06F 3/0673; G06F 11/2284; G06F 13/1668
See application file for complete search history.

(56) References Cited

U.S. PATENT DOCUMENTS

| | | | | |
|---|---|---|---|---|
| 6,886,109 B2* | 4/2005 | Olarig | ................ | G06F 9/4401 |
| | | | | 714/25 |
| 6,901,541 B2* | 5/2005 | Antosh | ................ | G11C 29/48 |
| | | | | 714/718 |
| 7,213,175 B2* | 5/2007 | Morrison | ........... | G06F 11/3672 |
| | | | | 714/38.14 |
| 7,246,269 B1 | 7/2007 | Hamilton | | |
| 7,313,717 B2* | 12/2007 | Vecoven | ............ | G06F 11/0712 |
| | | | | 714/4.2 |
| 7,320,086 B2* | 1/2008 | Majni | ................ | G06F 11/108 |
| | | | | 714/42 |
| 8,001,434 B1* | 8/2011 | Lee | ...................... | G11C 29/10 |
| | | | | 714/733 |

(Continued)

OTHER PUBLICATIONS

"HyperTransport™ I/O Link Specification"; HyperTransport™ Technology Consortium; White Paper; Document #HTC20031125-0035-0009; Revision 2.00b; Apr. 27, 2005; 325 pages.

*Primary Examiner* — Esaw T Abraham
(74) *Attorney, Agent, or Firm* — Polansky & Associates, P.L.L.C.; Paul J. Polansky; Nathan H. Calvert

(57) ABSTRACT

A memory module performs a memory readiness test, and reports results to a host system. The memory module initializes a status register with an initial ready time value and a memory readiness status. The memory module conducts the memory readiness test, and while conducting the memory readiness test, estimates a new ready time based on the progress of the memory readiness test. The memory module updates the ready time value in the status register based on the new ready time. After finishing the memory readiness test, the memory module updates the memory readiness status in the status register.

23 Claims, 5 Drawing Sheets

(56) References Cited

U.S. PATENT DOCUMENTS

| | | | |
|---|---|---|---|
| 8,225,028 B2* | 7/2012 | Kuo | G06F 12/0246 |
| | | | 711/103 |
| 8,516,298 B2* | 8/2013 | Lu | G06F 11/1666 |
| | | | 714/2 |
| 8,839,057 B2* | 9/2014 | Hughes | G11C 29/16 |
| | | | 714/718 |
| 9,335,952 B2* | 5/2016 | Buxton | G06F 3/0659 |
| 10,360,121 B2* | 7/2019 | Chou | G06F 11/2284 |

* cited by examiner

MEMORY INITIALIZATION REPORTING AND CONTROL

BACKGROUND

System interconnect bus standards provide for communication between different elements on a chip, or different elements with a multi-chip module, a circuit board, or a server node. For example, the popular Peripheral Component Interconnect Express (PCIe) developed by the Peripheral Components Special Interest Group is a high-speed serial expansion bus providing interconnection between elements on a motherboard, and connecting to expansion modules that plug into card slots or mount to a motherboard. While PCIe works well as an input output (I/O) protocol, it does not provide enough support for processing elements to communicate within a multi-core, heterogeneous processing model. Improved system interconnect standards are needed to provide for improved system architectures having multiple processor cores together with expansion memory and accelerators such as Graphic Processing Units (GPUs) and Field-Programmable Gate Arrays (FPGAs).

Improved system interconnect standards are also needed to allow multiple processors to share memory in an efficient manner. As such memory sharing improves, the capacity of expansion memory modules will tend to increase. Along with the increased capacity of memory expansion devices comes issues such as increased initialization times due to functionality testing of such a large memory pool, and large numbers of memory repair operations.

Figure 1:
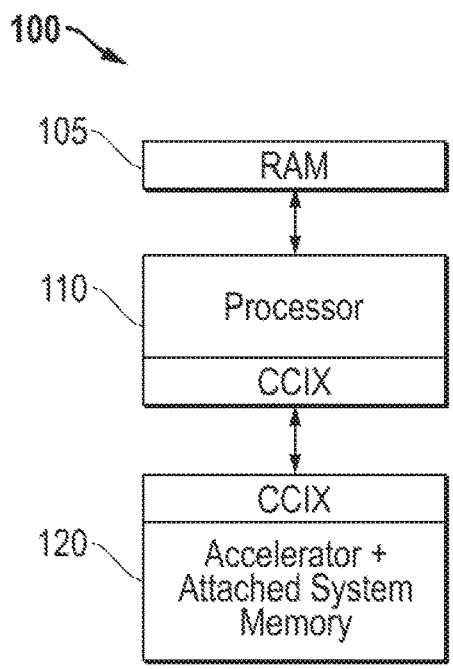
FIG. 1 illustrates in block diagram form a data processing platform connected in an exemplary topology according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A system includes a memory module with a memory, a memory controller connected to the memory, and a bus interface circuit connected to the memory controller which sends and receives data on an external bus. Responsive to an initialization process of the memory module, the memory controller initializes a status register with an initial ready time value and a memory readiness status. The memory controller conducts a memory readiness test, and while conducting the memory readiness test, estimates a new ready time based on progress of the memory readiness test. The memory controller updates the ready time value in the status register based on the new ready time. After finishing the memory readiness test, the memory controller updates the memory readiness status in the status register. The system further includes a processor connected to the bus. The processor accesses the status register through the bus, determines a current ready time value, and checks for results of the memory readiness test.

A memory module includes a memory with at least one memory chip, a memory controller connected to the memory, and a bus adapter which sends and receives data on an external bus. Responsive to an initialization process of the memory module, the memory controller initializes a status register with a ready time value and a memory readiness status. The memory controller enables the status register to be accessed through the external bus. The memory controller conducts a memory readiness test, and while conducting the memory readiness test, estimates a new ready time based on progress of the memory readiness test. The memory controller updates the ready time value in the status register based on the new ready time. Upon finishing the memory readiness test, the memory controller updates the memory readiness status in the status register.

A method includes responding to an initialization process at a memory module by initializing a status register with an initial ready time value and a memory readiness status. A memory readiness test is conducted on the memory module, and while conducting the memory readiness test, estimates a new ready time based on progress of the memory readiness test. The method updates the ready time value in the status register based on the new ready time, and provides access to the new ready time value over an external bus. After finishing the memory readiness test, the method updates the memory readiness status in the status register.

A memory module includes a memory with at least one memory chip, a memory controller coupled to the memory, and a bus adapter connected to the memory controller which send and receive data on an external bus. In response to an initialization process of the memory module, the memory controller initializes a status register with memory readiness status and a ready time value indicating an expected amount of time to conduct a memory readiness test. The status register is enabled to be accessed through the bus. The memory controller conducts the memory readiness test on the memory, and upon finishing, update the memory readiness status in the status register.

The initialization techniques herein provide several improvements over a typical initialization process in which only the initialization result is reported. The techniques allow memory modules to provide the system with initial information regarding how long the test should take, allowing testing that is specific to the particular memory technology or conditions to be made without stalling the initialization process. These techniques further allow much more flexibility in the system boot process, or the reset process for the memory module, because they allow the BIOS or system driver to be provided ongoing updates when extended readiness checks and repairs are needed, without initiating an error. This capability extends the operational life of memory modules using technologies that tend to have repair operations as they age. Further, these techniques provide improved interoperability because they allow substitution of memory modules with different base technologies without significantly altering the initialization process. These techniques also provide for consistent operation as memory expansion modules increase to large, multi-terabyte sizes that take much longer than prior technologies to complete readiness tests.

FIG. 1 illustrates in block diagram form a data processing platform 100 connected in a simple exemplary topology provided by CCIX. A host processor 110 ("host processor," "host") is connected using the CCIX protocol to an accelerator module 120, which includes a CCIX accelerator and an attached memory on the same device. The CCIX protocol is found in CCIX Base Specification 1.0 published by CCIX Consortium, Inc., and in later versions of the standard. CCIX is an interconnect provided by the Cache Coherent Interconnect for Accelerators (CCIX) standard, to which the present inventors are contributors. This standard seeks to improve interconnect and cache coherence performance for acceleration applications such as parallel processing, network processing, and low latency memory expansion. The standard provides a CCIX link which enables hardware-based cache coherence, which is extended to accelerators and storage adapters. In addition to cache memory, CCIX enables expansion of the system memory to include CCIX device expansion memory. The CCIX architecture thereby allows multiple processors to access system memory as a single pool. Such pools may become quite large as processing capacity increases, requiring the memory pool to hold application data for processing threads on many interconnected processors. Storage memory also become large for the same reasons.

Data processing platform 100 includes host random access memory (RAM) 105 connected to host processor 110, typically through an integrated memory controller. The memory of accelerator module 120 can be host-mapped as part of system memory in addition to the RAM 105, or exist as a separate shared memory pool. The CCIX protocol is employed with data processing platform 100 to provide expanded memory capabilities, including functionality provided herein, in addition to the acceleration and cache coherency capabilities of CCIX.

Figure 2:
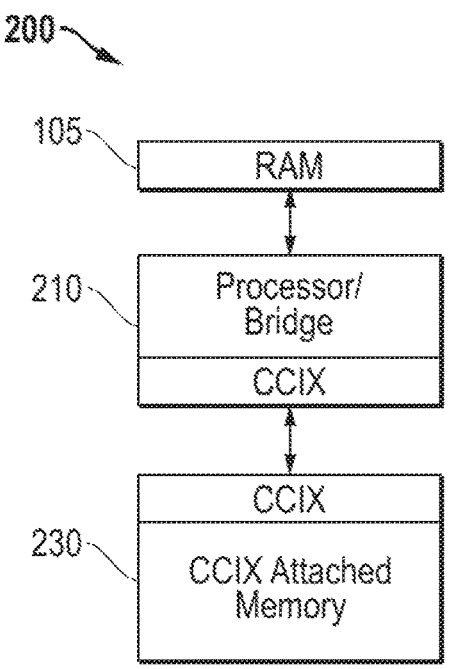
FIG. 2 illustrates in block diagram form a data processing platform connected in another exemplary topology according to some embodiments.

FIG. 2 illustrates in block diagram form a data processing platform 200 with another simple topology for CCIX applications. Data processing platform 200 includes a host processor 210 connected to host RAM 105. Host processor 210 communicates over a bus through a CCIX interface to an expansion module 230 that includes memory. Like the embodiment of FIG. 1, the memory of expansion module 230 can be host-mapped as part of system memory. The expanded memory capability may offer expanded memory capacity or allow integration of new memory technology beyond that which host processor 210 is capable of directly accessing, both with regard to memory technology and memory size.

Figure 3:
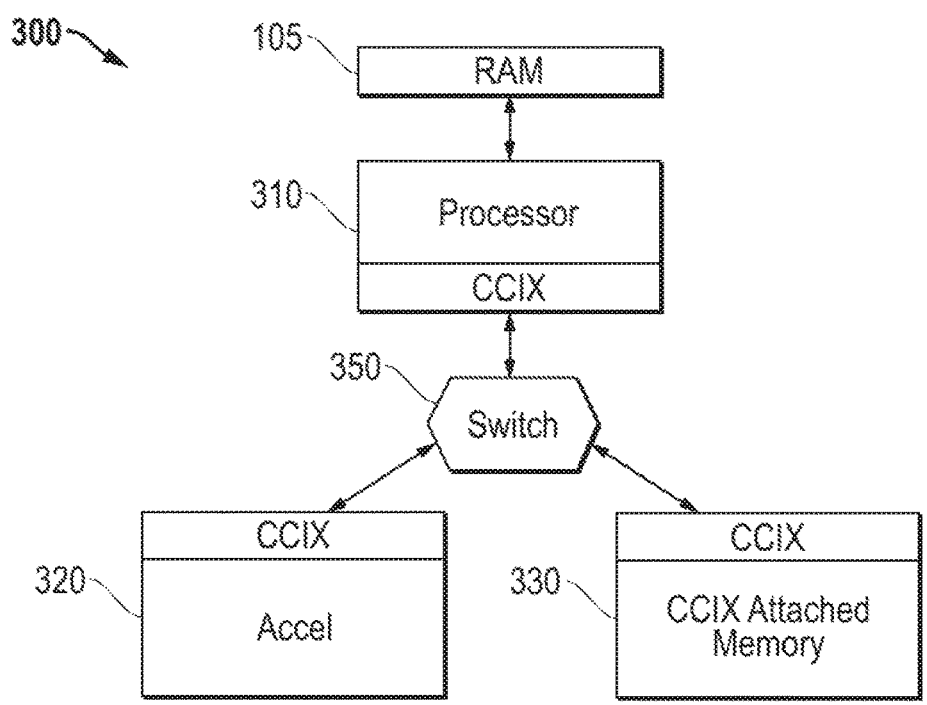
FIG. 3 illustrates in block diagram form a data processing platform connected in a more complex exemplary topology according to some embodiments.

FIG. 3 illustrates in block diagram form a data processing platform 300 with a switched topology for CCIX applications. Host processor 310 connects to a CCIX-enabled switch 350, which also connects to accelerator module 320 and expansion module 330. The expanded memory capabilities and capacity of the prior directly-connected topologies are provided in data processing platform 300 by connecting the expanded memory through switch 350. While several exemplary topologies are shown for a data processing platform, the techniques herein may be employed with other suitable topologies including mesh topologies.

Figure 4:
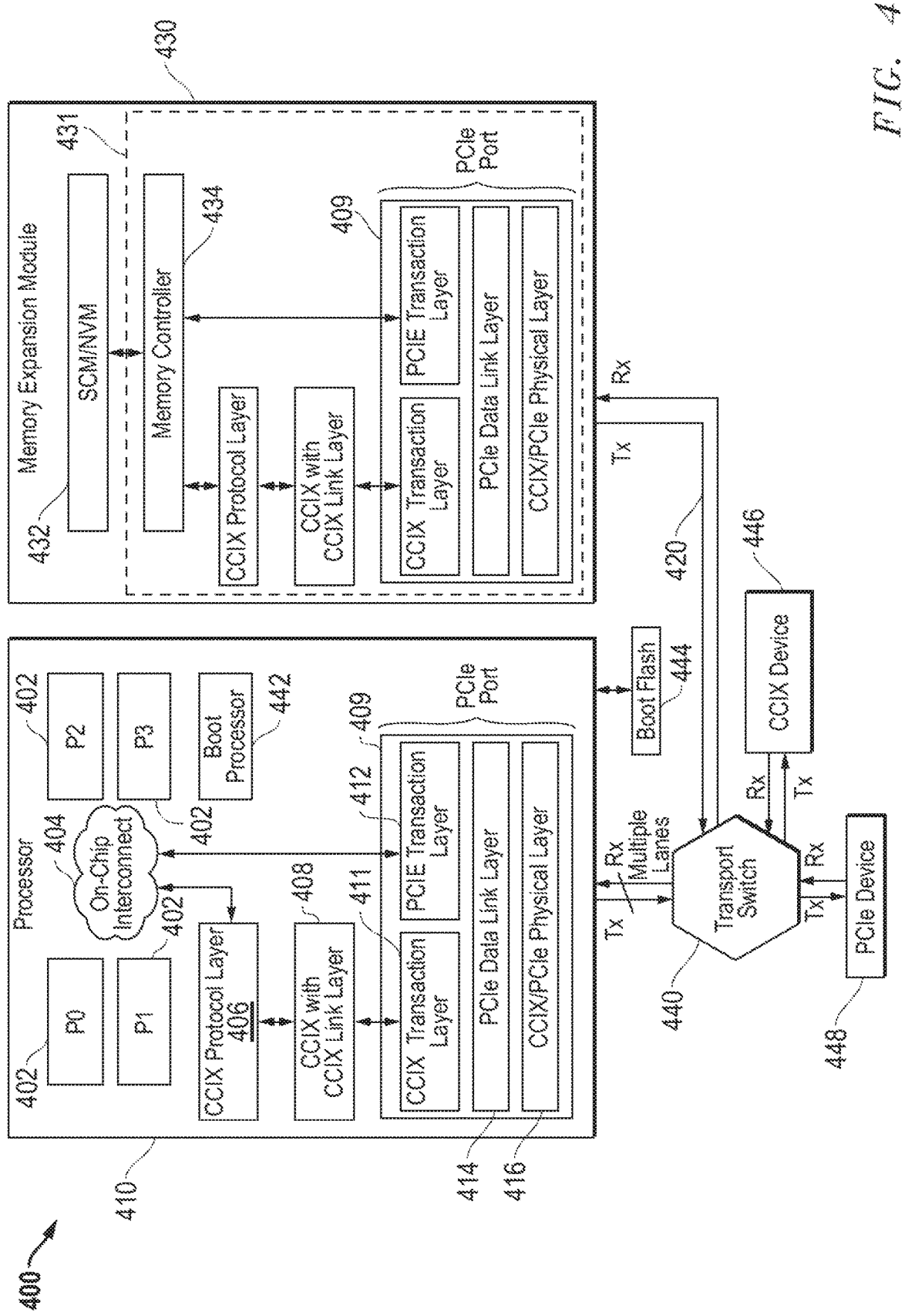
FIG. 4 illustrates in block diagram from a design of an exemplary data processing platform configured according to the topology of FIG. 3.

FIG. 4 illustrates in block diagram from a design of an exemplary data processing platform 400 with a topology similar to that of FIG. 3. Generally, host processor 410 connects to a memory expansion module 430 over a PCIe bus 420, through a CCIX-enabled transport switch 440. While a switched connection is shown, point-to-point connection is also possible and the techniques herein may be employed with other topologies employing CCIX data processing platforms, such as grid peer-to-peer connections. Other data processing protocols with packet-based communication links may also use the techniques herein. An additional CCIX device 446 is shown connected to transport switch 440. A PCIe device 448, not hosting any CCIX agents, is also connected through transport switch 440. Host processor 410 includes a boot processor 442 connected to boot flash memory 444 over a suitable local bus. Boot flash memory 444 contains executable code to boot data processing platform 400 and perform BIOS functions under control of boot processor 442.

Host processor 410 includes four processor cores 402, interconnected by an on-chip interconnect network 404. This number of processor cores 402 is merely exemplary, and the processors employed for various embodiments of data processing platform 400 will often include many more processor cores, such as 32 or 64 cores all connected with an on-chip interconnect network. As shown, on-chip interconnect network 404 links each processor to an I/O port 409, which in this embodiment is a PCIe port enhanced to include a CCIX transaction layer 411 and a PCIe transaction layer 412. I/O port 409 provides a CCIX protocol interconnect to memory expansion module 430 that is overlaid on a PCIe physical link on PCIe bus 420. Alternatively, the CCIX traffic may be carried over transports other than PCIe. In this example, PCIe port 409 is enhanced to carry the CCIX coherency traffic while reducing latency introduced by the PCIe transaction layer.

To provide such lower latency for CCIX communication, CCIX provides a light weight CCIX transaction layer 411 that independently links to the PCIe data link layer 414 alongside the standard PCIe transaction layer 412. Additionally, a CCIX link layer controller 408 is overlaid on a physical transport like PCIe to provide sufficient virtual transaction channels necessary for deadlock free communication of CCIX protocol messages. The CCIX protocol layer controller 406 connects CCIX link layer controller 408 to the on-chip interconnect and manages traffic in both directions. CCIX protocol layer controller 406 is operated by any of a number of defined CCIX agents running on host processor 410.

Any CCIX protocol component that sends or receives CCIX requests is referred to as a CCIX agent. The agent may be a Request Agent, a Home Agent, or a Slave agent. A Request Agent is a CCIX Agent that is the source of read and write transactions. A Home Agent is a CCIX Agent that manages coherency and access to memory for a given address range. As defined in the CCIX protocol, a Home Agent manages coherency by sending snoop transactions to the required Request Agents when a cache state change is required for a cache line. Each CCIX Home Agent acts as a Point of Coherency (PoC) and Point of Serialization (PoS) for a given address range. CCIX enables expanding system memory to include memory attached to an external CCIX Device. When the relevant Home Agent resides on one chip and some or all of the physical memory associated with the Home Agent resides on a separate chip, generally an expansion memory module of some type, the controller of the expansion memory is referred to as Slave Agent. The CCIX protocol also defines an Error Agent, which typically runs on a processor with another agent to handle errors.

Memory expansion module 430 may be an expansion card type module with a PCIe connector, or may take the form of other expansion modules and or be built in to the motherboard carrying host processor 410. Memory expansion module 430 includes a memory 432 with one or more memory chips, and an interface controller 431, typically a separate chip. Interface controller 431 includes a memory controller 434 and an I/O port 409 connected to PCIe bus 420. Multiple channels or a single channel may be used in the connection. A CCIX slave agent is executed by the memory controller 434 and its associated CCIX protocol layer. Memory expansion module 430 may be used in a memory-centric architecture or a traditional, processor-centric architecture as supported by CCIX. In this exemplary, memory 432 is a storage class memory (SCM) or a nonvolatile memory (NVM). However, these examples are not limiting, and many types of memory expansion modules may employ the techniques described herein. For example, a memory with mixed NVM and RAM may be used, such as a high-capacity flash storage or 3D crosspoint memory with a RAM buffer. Memory controller 434 is connected to memory 432 over a local high-speed bus. Memory controller 434 may be integrated on an interface controller chip (431) with some or all of the port circuitry of I/O port 409, the associated CCIX protocol layer controller 406, and CCIX link layer controller 408. Memory controller 434 manages an initialization process in which memory expansion module 430 conducts initialization testing of memory 432 and reports status to the BIOS startup process, as further described below.

While this embodiment employs a communication link conforming to the CCIX standard, this characteristic is not limiting, and other high speed communication link standards may instead be used. For example, a Gen-Z standard such as that described in the Gen-Z Core Specification 1.0, published by the Gen-Z Consortium, may be used.

Figure 5:
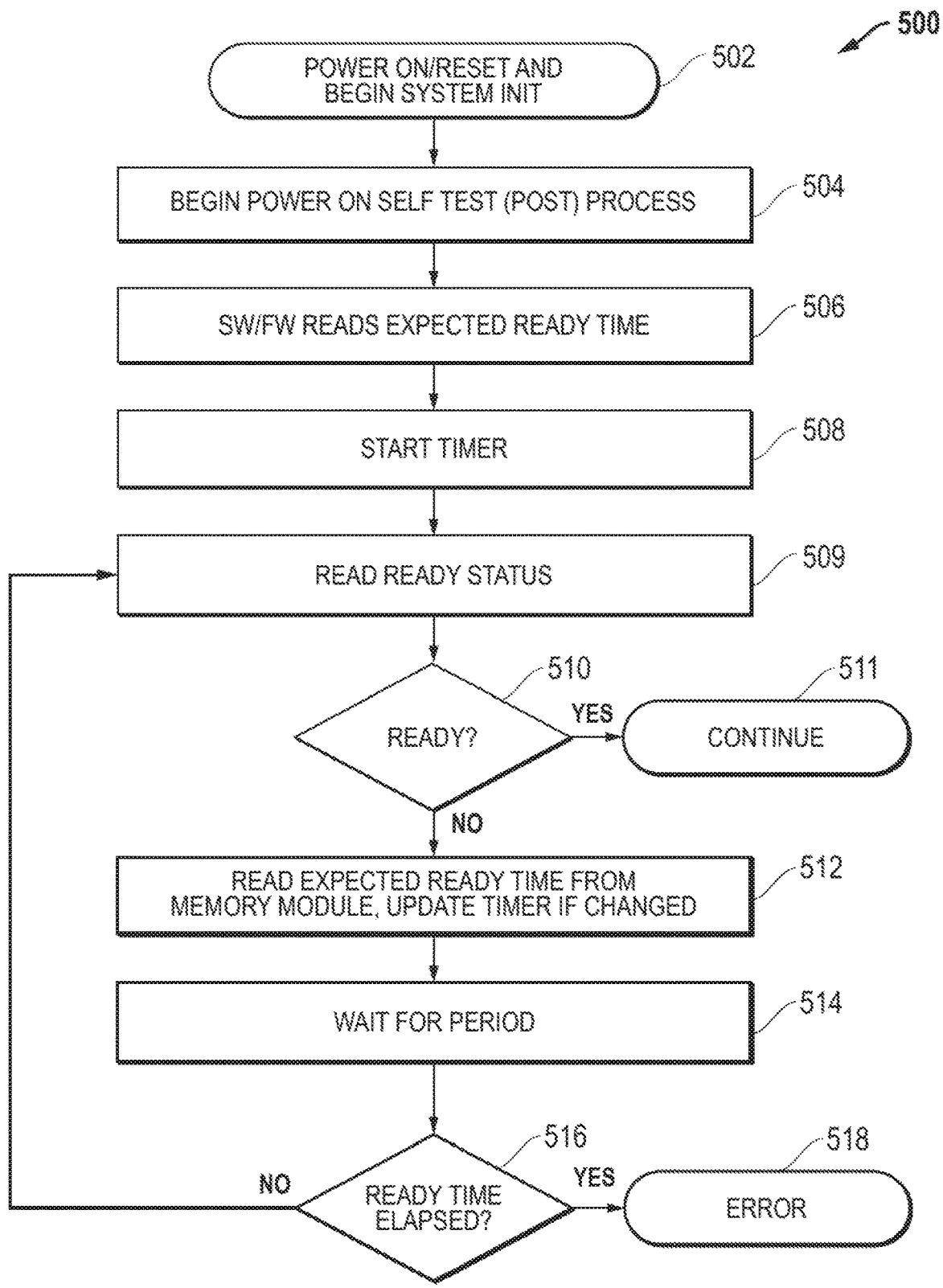
FIG. 5 shows in flow diagram form an exemplary process for system BIOS (basic input/output system) to initialize a memory expansion module according to some embodiments.

FIG. 5 shows in flow diagram form an exemplary process 500 for system BIOS to initialize a memory expansion module, for example, during initialization of data processing platform 400 of FIG. 4. Process 500 begins at block 502 as data processing platform 400 is powered on or reset, and begins its initialization process under control of boot processor 442, typically executing a BIOS loaded from boot flash 444. Next at block 504, process 500 begins the power on self test (POST) process, in which the BIOS directs testing of various subsystems. Block 504 may include powering on the expansion module, resetting it, or sending the expansion module a command to begin the self test process. At this point, communications are occurring through the system bus or expansion bus on which the relevant expansion module is connected—in this exemplary the PCIe bus 420 initialized by the BIOS. However, this example is not limiting, and the techniques herein may be employed over other communication links, including motherboard busses, wired links, and in-rack communications links.

A ready time value is initialized by the expansion module, as described with regard to FIG. 6 below, and is available to be read by the system BIOS software/firmware as shown at block 506. The ready time value describes the time in which the expansion module self-test is expected to be complete. The register access at block 506 is preferably done by remotely reading a register of memory controller 434. Reading the register may be accomplished by reading a particular memory location (memory-mapped register) or otherwise sending a command to the memory controller and receiving a response. Process 500 may also read other values from the register, such as a ready time scale to indicate the units of time described by the ready time value.

Based on the ready time value, process 500 at block 508 starts a timer to indicate when the ready time has elapsed. Then process 500 repeats a set of steps until the ready time is elapsed as indicated at block 516. At block 509 the ready status is checked to see if the module has updated the status to indicate the self-testing is completed. If the ready status indicates the expansion module is ready, process 500 at block 510 goes to block 511 where it continues system startup or operation.

Process 500 also repeatedly reads the expected ready time from the expansion module at block 512, and updates the timer if the ready time value has changed. Then process 500 waits for a period, such as one second or 0.1 seconds at block 514, and continues repeating the loop. The ready status and ready time may both be provided in the same register, requiring only a single read of the register in each loop. It should be noted that the self test process of the memory expansion module 430 may take a relatively long period of time compared to other POST procedures conducted by other system elements due to the large size of the memory being tested. Due to the long test time, the depicted process may begin under control of the system BIOS such as that of host processor 410, and finish under control of the host processor when it is fully booted. If the ready time elapses without the ready status being updated, at block 516, process 500 goes to block 518 where it recognizes an error. Block 518 may restart the process, exit, or otherwise respond to the error. While, in this embodiment, the system BIOS monitors the ready status of memory expansion module 430, the process may instead be monitored by firmware running on a service processor.

Figure 6:
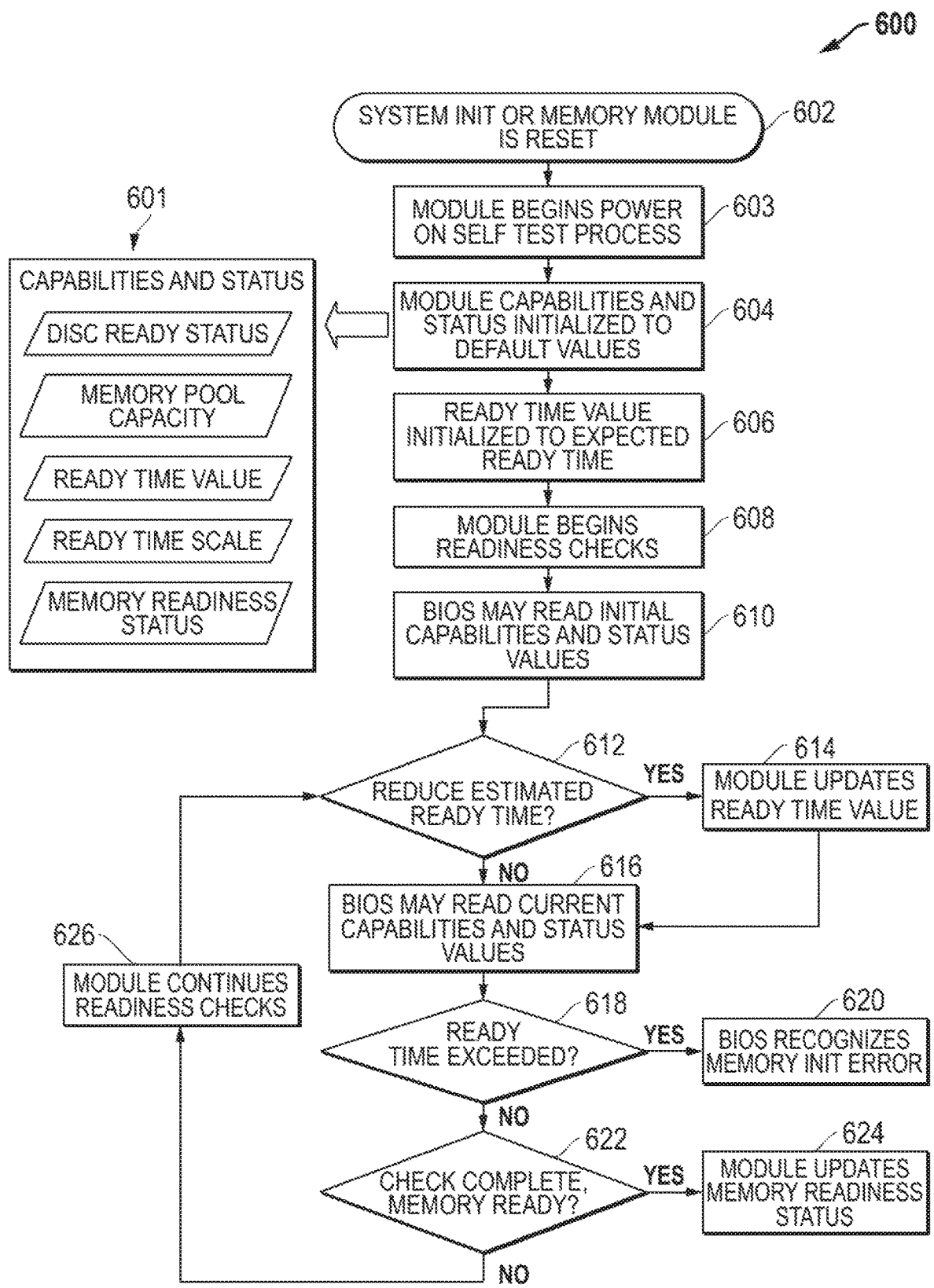
FIG. 6 shows in flow diagram form an exemplary initialization process for a memory expansion module according to some embodiments.

FIG. 6 shows in flow diagram form an exemplary initialization process 600 for a memory expansion module according to some embodiments. Process 600 may be performed by an expansion module such as memory expansion module 430 (FIG. 4), and is typically performed under control of the module's memory controller executing suitable firmware. Process 600 begins at block 602 with the memory expansion module being powered on or reset, or otherwise receiving a reset command or initialization command from the system BIOS or other suitable management process. Next, at block 603, the memory expansion module begins its power on self test process. The testing process is typically begun automatically by the memory expansion module in response to being powered on or reset, but in some embodiments may be performed in response to receiving a command from an application on the host processor, such as through a driver.

In this example, the status of the memory expansion module is reported through a capabilities and status register 601, which is initialized with its default values at block 604. Preferably, capabilities and status register 601 includes the Slave Agent capabilities and status fields in CCIX protocols, as memory expansion module 430 appears in the CCIX protocol as a slave agent. Typically, the module's memory controller such as memory controller 434 (FIG. 4) enables access to the capabilities and status register 601, or otherwise reports the values over the bus upon request. Capabilities and status register 601 includes a discovery ready status indicator, which indicates whether the slave agent and its capabilities and control are ready to be discovered and configured. Next is a memory pool capacity indicator, showing a number of memory pools available. A ready time value describes an expected amount of time to conduct a memory readiness test. Preferably this ready time value registry field includes a hex value from which the readiness time is calculated in nanoseconds by multiplying by the value 32 raised to the value of the ready time scale indicator. Finally, status register 601 includes a memory readiness status indicator, which describes the module's memory pool readiness status. This indicator is typically a binary field set to '1' to show the memory self tests are complete and the memory pool's capabilities are ready to be discovered. Also, at block 606, process 600 sets the ready time value of capabilities and status register 601 to an expected ready time, indicating an expected amount of time to conduct memory readiness checks and tests.

Next at block 608, process 600 begins performing the memory readiness checks. The checks may include any of a variety of checks and tests needed to initialize large memory modules such as SCM, such as memory sizing, memory testing, memory repair, data recovery (if the memory is non-volatile and has errors), and memory bus training to configure the bus connection between memory controller and the memory chips in the expansion module. The checks are typically performed by the module's memory controller interacting with the memory chip(s) of the module. The process makes the register available to be read or accessed by the system BIOS as indicated at block 610.

As the readiness checks are performed, process 600 determines whether the estimated ready time indicated by the ready time value should be updated (typically reduced) based on progress of the tests, as shown at block 612. The determination at block 612 may be done by calculating a rate at which the checks are progressing, measured in percent complete over time or a testing rate in gigabytes per second, for example, and comparing that to the average rate provided by the current ready time value in the register. If the current rate is faster than that yielded by the current ready time value by a predetermined threshold such as 5% or 1%, for example, the decision is made to update the readiness time. While typically the process decides to reduce the estimated ready time, it may decide to reduce or increase the ready time in some embodiments. If the decision is yes at block 612, process 600 goes to block 614 where it estimates a new ready time and updates the ready time value. After block 614, or if there is no update to the ready time at block 612, process 600 goes into a loop or waiting state at including blocks 616, 618, 622, and 626, waiting for the readiness checks to be complete or for conditions to require an update to the estimated ready time. While the blocks are shown in order, process 600 may be event driven, responding to updated conditions at blocks, 612, 618, and 622. During the loop, the BIOS may read the updated value from the register 601 as indicated at block 616. If the memory readiness checks are stalled or continue so long that the ready time is exceeded as shown at block 618, the BIOS may terminate the process at block 620, or otherwise recognize an error and take action such as resetting the process. Block 622 monitors or periodically determines if the readiness checks are complete. When the checks are found to be complete, process 600 goes to block 624, where it updates the memory readiness status in the register to indicate that the memory is ready. If the checks are not complete, the readiness checks continue as shown at block 626, updating the ready time estimate as required, until the readiness checks are compete as shown at block 622.

Figure 7:
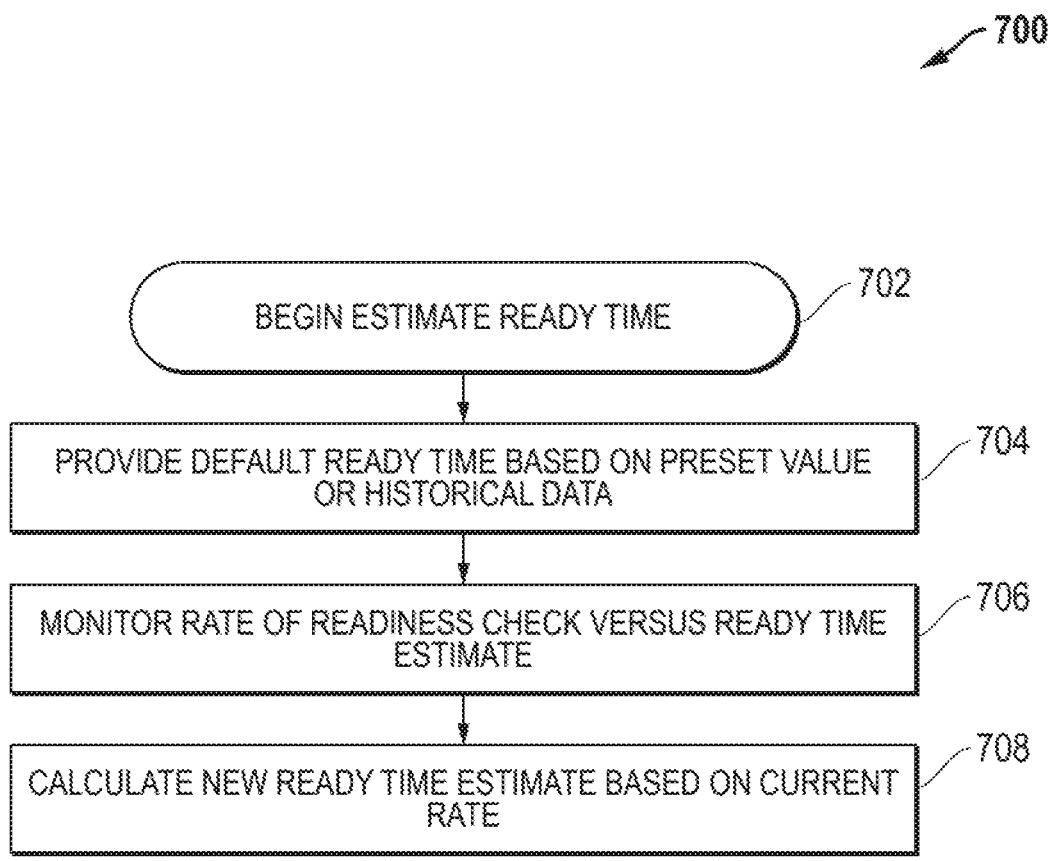
FIG. 7 shows in flow diagram form a process for estimating a ready time at a memory expansion module according to some embodiments.

FIG. 7 shows in flow diagram form a process 700 for estimating a ready time at a memory expansion module according to some embodiments. Generally, process 700 is employed when an estimated ready time is needed according to the techniques herein, such as at blocks 606, 612, and 614 in the exemplary process of FIG. 6, and is performed by a logic circuit in the memory expansion module, typically the memory controller. Process 700 is entered at block 702 and at block 704 provides a default ready time value to be provided in the initialized values in capabilities and status register 601. Block 704 is only performed for initialization of status register 601, such as at block 604 of FIG. 6. After the readiness checks are begun, at block 706, process 700 monitors the progress rate of the readiness checks. The rate may be calculated periodically over time or at regular intervals of testing such as every gigabyte or terabyte of memory tested. The calculated rate may be provided as required to the initialization process such as that of FIG. 6. Based on the calculated rate, a new ready time estimate is calculated at block 708. This calculation may include applying the rate to the remaining memory to be tested, or may include applying differing rates based on different types of tests yet to be completed. Such an updated ready time may be calculated at any point required by the memory expansion module process to manage the reporting of readiness tests, such as the process of FIG. 6.

The techniques herein may be used, in various embodiments, with any suitable systems that employ large memory expansion modules, for example, media servers and data processing platforms. Further, the techniques are broadly applicable for use with processors implemented with CPU and acceleration processors, including memory-centric architectures, in which memory expansion is connected to processors over a high-speed bus or communication link.

While particular embodiments have been described, various modifications to these embodiments will be apparent to those skilled in the art. For example, a single memory expansion module may support multiple memory pools. Multiple status registers may be employed to report the status of different pools. The memory controller may actively transmit ready time values to a monitoring process over the bus, or passively load them into a status register. The monitoring process may poll the status, or react to status change indications from the memory module.

Accordingly, it is intended by the appended claims to cover all modifications of the disclosed embodiments that fall within the scope of the disclosed embodiments.

What is claimed is:

1. A system, comprising:
   a memory module including a memory with at least one memory chip;
   a memory controller coupled to the memory; and
   a bus interface circuit coupled to the memory controller and configured to send and receive data on an external bus,
   the memory controller configured to:
      in response to an initialization process of the memory module, initialize a status register with an initial ready time value and a memory readiness status;
      conduct a memory readiness test on the memory;
      while conducting the memory readiness test, estimate a new ready time based on a current rate of completion of the memory readiness test;
      update the ready time value in the status register based on the new ready time; and
      after finishing the memory readiness test, update the memory readiness status in the status register; and
   a processor coupled to the bus and configured to:
      access the status register through the bus;
      determine a current ready time value; and
      check for results of the memory readiness test.

2. The system of claim 1, wherein the memory readiness test is part of a power on self test (POST) process.

3. The system of claim 1, wherein the processor repeatedly accesses the status register to determine if the current ready time value has changed.

4. The system of claim 1, wherein the memory controller receives and responds to memory requests according to a Cache Coherent Interconnect for Accelerators (CCIX) standard.

5. The system of claim 1, wherein the memory includes volatile memory and non-volatile memory.

6. The system of claim 1, wherein the memory controller is configured to selectively set the new ready time to be greater than an original ready time indicated by the initial ready time value.

7. The system of claim 1, wherein the memory controller is configured to selectively set the new ready time to be less than an original ready time indicated by the initial ready time value.

8. A memory module, comprising:
a memory including at least one memory chip;
a memory controller coupled to the memory;
a bus adapter coupled to the memory controller and configured to send and receive data on an external bus;
the memory controller configured to:
in response to an initialization process of the memory module, initialize a status register with a ready time value and a memory readiness status;
enable the status register to be accessed through the bus;
conduct a memory readiness test on the memory;
while conducting the memory readiness test, estimate a new ready time based on a current rate of completion of the memory readiness test;
update the ready time value in the status register based on the new ready time; and
upon finishing the memory readiness test, update the memory readiness status in the status register.

9. The memory module of claim 8, wherein the memory readiness test is part of a power on self test (POST) process.

10. The memory module of claim 8, wherein the memory controller receives and responds to memory requests according to a Cache Coherent Interconnect for Accelerators (CCIX) standard.

11. The memory module of claim 8, wherein the memory includes volatile memory and non-volatile memory.

12. The memory module of claim 8, wherein the memory controller is configured to selectively set the new ready time to be greater than an original ready time indicated by the initial ready time value.

13. The memory module of claim 8, wherein the memory controller is configured to selectively set the new ready time to be less than an original ready time indicated by the initial ready time value.

14. A method, comprising:
in response to an initialization process at a memory module, initializing a status register with an initial ready time value and a memory readiness status;
conducting a memory readiness test on the memory module;
while conducting the memory readiness test, estimating a new ready time based on a current rate of completion of the memory readiness test;
updating the ready time value in the status register based on the new ready time;
providing access to the new ready time value over an external bus; and
after finishing the memory readiness test, updating the memory readiness status in the status register.

15. The method of claim 14, wherein the memory readiness test is part of a power on self test (POST) process.

16. The method of claim 14, further comprising repeatedly accessing the status register over the external bus to determine if the current ready time value has changed.

17. The method of claim 14, wherein the memory module includes volatile memory and non-volatile memory.

18. The method of claim 14, further comprising selectively setting the new ready time to be greater than an original ready time indicated by the initial ready time value.

19. The method of claim 14, further comprising selectively setting the new ready time to be less than an original ready time indicated by the initial ready time value.

20. A memory module, comprising:
a memory including at least one memory chip;
a memory controller coupled to the memory;
a bus adapter coupled to the memory controller and configured to send and receive data on an external bus;
the memory controller configured to:
in response to an initialization process of the memory module, initialize a status register with memory readiness status and a ready time value indicating an expected amount of time to conduct a memory readiness test;
enable and perform at least one access of the status register through the bus;
conduct the memory readiness test on the memory; and
upon finishing the memory readiness test, update the memory readiness status in the status register.

21. The memory module of claim 20, wherein the memory readiness test is part of a power on self test (POST).

22. The memory module of claim 20, wherein the memory controller receives and responds to memory requests according to a Cache Coherent Interconnect for Accelerators (CCIX) standard.

23. The memory module of claim 20, wherein the memory includes volatile memory and non-volatile memory.

* * * * *